United States Patent [19]

Li et al.

[11] Patent Number: 5,898,320
[45] Date of Patent: Apr. 27, 1999

[54] PROGRAMMABLE INTERCONNECT POINT HAVING REDUCED CROWBAR CURRENT

[75] Inventors: Richard C. Li, Cupertino; Hy V. Nguyen; Patrick J. Crotty, both of San Jose, all of Calif.

[73] Assignee: Xilinx, Inc., San Jose, Calif.

[21] Appl. No.: 08/823,270

[22] Filed: Mar. 27, 1997

[51] Int. Cl.⁶ .................................................. H03K 19/017

[52] U.S. Cl. ........................ 326/58; 326/121; 326/50; 326/27

[58] Field of Search ........................ 326/56, 57, 58, 326/83, 121, 49, 50, 44, 45, 26, 27, 119

[56] References Cited

U.S. PATENT DOCUMENTS 4,855,619  8/1989  Hsieh et al. .................................. 326/44

Primary Examiner—Michael Tokar
Assistant Examiner—Qui Van Duong
Attorney, Agent, or Firm—Edel M. Young

[57] ABSTRACT

Problems associated with excessive crowbar current due to input signal transitions at a buffered programmable interconnect point are solved by inserting a transistor switch between power and ground. The inserted switch is in series with the input buffer and is controlled by a memory cell which also controls the pass/no-pass state of the interconnect. An OFF inserted switch blocks current that flows during switching when the memory cell output causes a no-pass state of the interconnect.

6 Claims, 2 Drawing Sheets

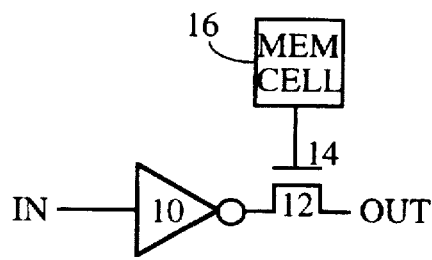
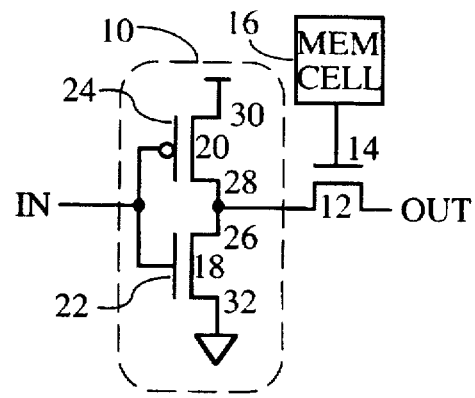
FIG. 1
PRIOR ART
FIG. 2
PRIOR ART
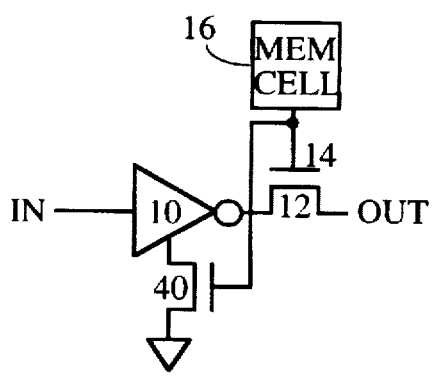
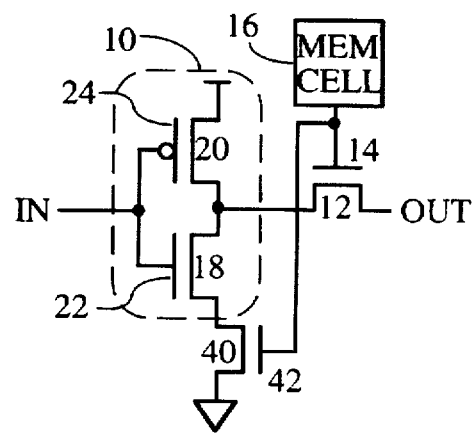
FIG. 3
FIG. 4

PROGRAMMABLE INTERCONNECT POINT HAVING REDUCED CROWBAR CURRENT

FIELD OF THE INVENTION

The present invention relates generally to field programmable gate arrays (FPGAs) and more specifically to buffered programmable interconnect points used in FPGAs to programmably pass or not pass signals depending on the state of the output of a memory cell connected to a switchable transistor.

BACKGROUND OF THE INVENTION

A conventional buffered programmable interconnect point comprises an inverter feeding the source of an N-type field effect transistor, the gate of which is connected to a memory cell. The output of the memory cell determines whether the transistor is ON or OFF and thus whether or not the input to the inverter is passed through the transistor. The inverter comprises a complementary pair of CMOS transistors (i.e., N- and P-type having their respective gates connected to each other at the inverter input and also having their respective drains connected to each other at the inverter output). The P-transistor source is connected to a supply voltage and the N-transistor source is connected to ground. Normally, one or the other of the two transistors conducts depending on the voltage level of the input to the inverter. If the input voltage is high, corresponding to logic true, the N-transistor conducts, producing a logic low at the inverter output. If the input voltage is zero, corresponding to logic low, the P-transistor conducts, causing the output voltage to be raised to the supply voltage level, thereby producing a logic high at the inverter output.

However, a problem arises on both enabled and disabled programmable interconnect points while an input voltage is in transition. Specifically, during a voltage change at the input, both inverter transistors are momentarily in an ON state, thereby creating a current path from the supply voltage to ground (from the source of the P-transistor to the source of the N-transistor). This "crowbar current" problem is exacerbated when there are many buffered programmable interconnect point on one line such as on long signal paths or clock lines in an FPGA. If there is sufficient current flow through numerous such inverters the device consumes high power, and ground bounce can occur (i.e., ground is no longer truly zero volts). Ground bounce can cause inaccuracies and logic anomalies.

Accordingly, there is a need to provide buffered programmable interconnect points wherein a transition of the input signal does not enable a current path from the power line to the ground line.

SUMMARY OF THE INVENTION

The present invention overcomes the crowbar current problem with conventional buffered programmable interconnect point circuits by adding an N-type transistor in series with the CMOS inverter and connecting the gate of the additional transistor to the output of the memory cell. When the memory cell is OFF, thereby turning off the interconnect point, the added N-type transistor is also OFF. In this OFF condition, the added transistor prevents current flow even during input signal transitions. A second embodiment of the invention substitutes a two-input NAND gate for the inverter. The input signal is one input to the NAND gate and the memory cell provides a second input to the NAND gate. The memory cell input to the NAND gate includes a connection to the gate of an N-type transistor connected between the power source and ground in the same fashion as the first embodiment. Thus, when the memory signal is low, this version of the invention also interrupts any current that would otherwise flow during input signal transitions.

BRIEF DESCRIPTION OF THE DRAWINGS

FIG. 1 is a block diagram of a prior art buffered programmable interconnect point;

FIG. 2 is a circuit diagram of the prior art buffered programmable interconnect point of FIG. 1;

FIG. 3 is a diagram of a buffered programmable interconnect point modified in accordance with a first embodiment of the invention;

FIG. 4 is a circuit diagram of the embodiment of the invention shown in FIG. 3;

DETAILED DESCRIPTION OF PREFERRED EMBODIMENTS

Figure 5:
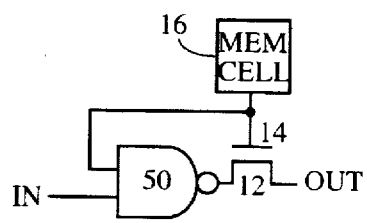
FIG. 5 is a block diagram of a second embodiment of the invention.

Referring to the accompanying figures and initially to FIGS. 1 and 2, it will be seen that a conventional buffered programmable interconnect point (PIP), comprises a CMOS inverter 10 feeding a transistor switch 12. The gate 14 of transistor switch 12 is connected to the output of a memory cell 16. The output of the memory cell 16 determines whether transistor 12 is ON or OFF and thus whether or not the input to inverter 10 is passed through transistor 12. As seen in FIG. 2, inverter 10 comprises a complementary pair of CMOS transistors 18 and 20 (i.e., N- and P-type) having their respective gates 22 and 24 connected to each other at the inverter input and also having their respective drains 26 and 28 connected to each other at the inverter output. The P-transistor source 30 is connected to a supply voltage and the N-transistor source 32 is connected to ground. Normally, one or the other of the two transistors 18 and 20 conducts depending on the voltage level of the input to the inverter. If the input voltage is high, corresponding to logic "1", the N-transistor 18 conducts producing a logic "0" at the inverter output. If the input voltage is zero, corresponding to logic "0", the P-transistor 20 conducts causing the output voltage to be raised to the supply voltage level thereby producing a logic "1" at the inverter output.

However, a problem arises even on disabled programmable interconnect points while an input voltage is in transition. Specifically, during a voltage change at the input, both inverter transistors 18 and 20 are momentarily in an ON state thereby creating a current path from the supply voltage to ground from the source of the P-transistor 20 to the source of the N-transistor 18.

Turning now to FIGS. 3 and 4, it will be seen that in a first embodiment of the invention, an additional N-type transistor 40 is placed between inverter 10 and ground. The gate 42 of transistor 40 is connected to the output of memory cell 16. Therefore, when the memory cell is OFF, transistor 40 is also OFF, thereby interrupting current which would otherwise flow during input signal transitions.

Figure 6:
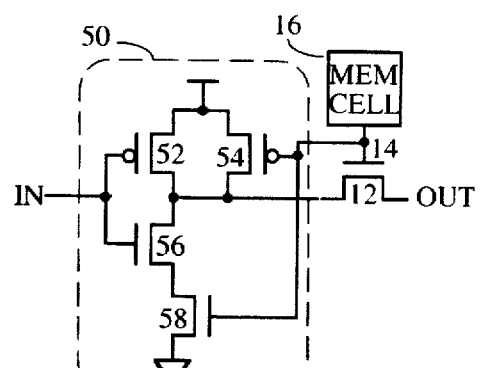
FIG. 6 is a circuit diagram of the second embodiment.

A second embodiment of the invention may be understood by referring to FIGS. 5 and 6. In this alternative version of the invention, a two-input NAND gate 50 is utilized as the input buffer. One input to the NAND gate 50 is the signal input to the PIP and the other is the output of the memory cell 16. As best seen in FIG. 6, NAND gate 50 comprises a pair of parallel-connected PMOS transistors 52 and 54 and a pair of serially-connected NMOS transistors 56 and 58. The input to the PIP is connected to the respective gates of transistors 52 and 56. The output of memory cell 16 is connected to the respective gates of transistors 54 and 58. When the memory cell output is high, transistor 54 is OFF and transistor 58 is ON. The signal IN to NAND gate 50 is thus passed through the ON transistor 12, the output of the PIP depending upon the logic state of the input. However, with the memory cell output OFF, transistor 58 is OFF, thereby preventing current flow from the supply voltage to ground during input signal transitions. Thus, the version of the invention shown in FIGS. 5 and 6, has the same advantageous effect of preventing inadvertent current flow as long as the memory cell output is at zero.

Figure 7:
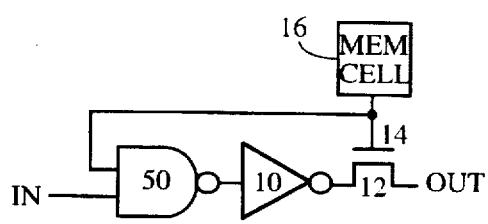
FIG. 7 is a block diagram of a third embodiment of the invention.
Figure 8:
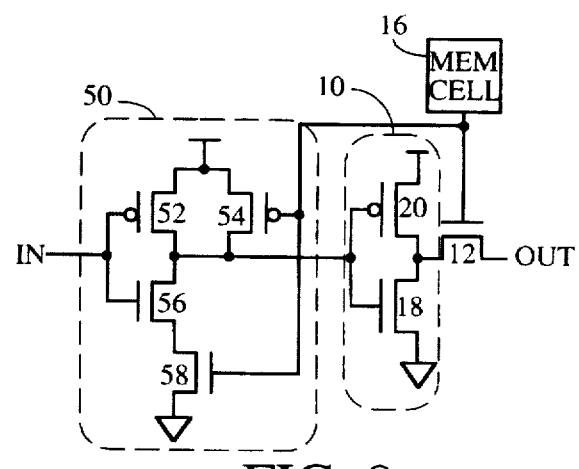
FIG. 8 is a circuit diagram of the third embodiment.

A third embodiment of the invention is illustrated in FIGS. 7 and 8. This embodiment produces a non-inverted output signal. The embodiment of FIGS. 7 and 8 replaces a pass gate following two inverters with a NAND gate followed by an inverter, and results in a non-inverting programmable interconnect point. With the memory cell control applied to NAND gate 50 instead of to inverter 10, both NAND gate 50 and inverter 10 are placed into a state without crowbar current when memory cell 16 turns off transistor 12. An implementation of the circuit is shown in FIG. 8.

One can see by comparing FIGS. 4 and 6 that the difference at a circuit level is the addition of transistor 54 in FIG. 6. Transistor 54 also appears in FIG. 8. The benefit of this transistor can be seen in FIG. 8. When a low signal from memory cell 16 turns off transistor 58 and a high IN signal turns off memory cell 52, transistor 54 turns on and prevents the input of inverter 10 from floating to an intermediate level and causing high current through inverter 10.

The above embodiments all use an N-channel transistor to disconnect the path from power to ground. It is equally possible, and within the scope of the present invention to use a P-channel transistor, preferably connected to the positive voltage source. These transistors for avoiding crowbar current are placed next to the voltage rail in order to improve switching speed because the input signal is expected to switch more frequently than the memory cell value. However, in some situations it may be preferred to place the transistors for avoiding crowbar current at other positions in the series path between power and ground, and such placement is also within the scope of the present invention.

Having thus disclosed preferred embodiments of the invention in sufficient detail to enable those skilled in the relevant art to make and use the various possible implementations thereof, what we claim is:

1. A programmable interconnect point comprising:

an inverter having an input terminal for receiving an input signal and having an output terminal for generating an output signal, the inverter being connected to a first source of voltage;

a first transistor switch connected to said output terminal of said inverter and being switchable at a gate terminal between ON and OFF conditions for selectively passing and blocking said output signal of said inverter;

a memory cell connected to said gate terminal of said first transistor switch for switching said first transistor switch between said ON and OFF conditions; and a second transistor switch connected in series between said inverter and a second source of voltage and having a gate terminal connected to said memory cell for preventing current flow through said inverter between said first and second sources of voltage when said memory cell has switched said first transistor to an OFF condition.

2. The programmable interconnect point recited in claim 1 wherein said inverter comprises a complementary pair of CMOS transistors.

3. The programmable interconnect point recited in claim 1 wherein said first and second transistors comprise CMOS devices.

4. The programmable interconnect point recited in claim 1 wherein said second transistor is connected between said inverter and ground.

5. A programmable interconnect point for selectively passing input signals at an input terminal to an output terminal depending upon the output level of an addressable memory cell; the device comprising:

a first switching connected between said input terminal and said output terminal and having a first control terminal connected to said memory cell for opening and closing said first switch in accordance with said memory cell output level;

an inverter connected between said input terminal and said first switch, said inverter also being connected between a source of voltage and ground potential for generating an output which is the logical inverse of said input signals; and a second switch connected in series with said inverter between said source of voltage and ground potential, said second switch having a second control terminal connected to said memory cell for opening and closing said second switch in accordance with said memory cell output level for preventing current flow between said source of voltage and ground potential through said inverter when said memory cell output level is zero.

6. A programmable interconnect point for selectively passing input signals at an input terminal to an output terminal depending upon the output logic state of an addressable memory cell; the device comprising:

a first switch connected between said input terminal and said output terminal and having a first control terminal connected to said memory cell for opening and closing said first switch in accordance with said memory cell output level;

a NAND gate connected between said input terminal and said first switch, said NAND gate also being connected between a source of voltage and ground potential for generating an output which is the logical inverse of said input signals; and Said NAND gate having a second switch connected between said source of voltage and ground potential, said second switch having a second control terminal connected to said memory cell for opening and closing said second switch in accordance with said memory cell output logic state for preventing current flow between said source of voltage and ground potential through said NAND gate when said memory cell output logic state is "FALSE".

* * * * *